(12) United States Patent
Yamakawa et al.

(10) Patent No.: US 8,416,028 B2
(45) Date of Patent: Apr. 9, 2013

(54) VOLTAGE CONTROLLED OSCILLATOR AND ELECTRONIC COMPONENT

(75) Inventors: Junichiro Yamakawa, Sayama (JP); Kazuo Akaike, Sayama (JP); Tatsunori Onzuka, Sayama (JP); Toshimasa Tsuda, Sayama (JP); Mikio Takano, Sayama (JP); Yasushi Yamamoto, Sayama (JP); Susumu Yoshimoto, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 12/924,467

(22) Filed: Sep. 28, 2010

(65) Prior Publication Data
US 2011/0080226 A1    Apr. 7, 2011

(30) Foreign Application Priority Data
Oct. 5, 2009    (JP) ................. 2009-231972

(51) Int. Cl.
*H03B 5/01*    (2006.01)

(52) U.S. Cl. .......... 331/177 V; 331/117 R; 331/117 FE; 331/167

(58) Field of Classification Search ............ 331/107 SL, 331/167, 177 V, 117 R, 117 FE
See application file for complete search history.

(56) References Cited

U.S. PATENT DOCUMENTS

| | | | |
|---|---|---|---|
| 5,532,651 A | 7/1996 | Jager et al. | |
| 5,600,279 A | 2/1997 | Mori | |
| 6,018,282 A | 1/2000 | Tsuda | |
| 6,046,647 A | 4/2000 | Nelson | |
| 6,072,371 A | 6/2000 | Kobayashi et al. | |
| 6,606,006 B1 | 8/2003 | Alexandersson | |
| 6,949,811 B2 | 9/2005 | Miyazawa | |
| 7,746,232 B2 | 6/2010 | Hashimoto | |
| 2003/0183864 A1 | 10/2003 | Miyazawa | |
| 2007/0205956 A1 | 9/2007 | Hashimoto | |
| 2010/0219927 A1 | 9/2010 | Hashimoto | |

FOREIGN PATENT DOCUMENTS

| | | |
|---|---|---|
| GB | 1 287 209 | 8/1972 |
| JP | 58-012315 | 1/1983 |
| JP | 62-162317 | 7/1987 |
| JP | 4-361407 | 12/1992 |
| JP | 7-131243 | 5/1995 |
| JP | 8-079069 | 3/1996 |
| JP | 10-209714 | 8/1998 |

(Continued)

OTHER PUBLICATIONS

U.S. Appl. No. 12/924,417, filed Sep. 27, 2010, Tsuda et al.

(Continued)

*Primary Examiner* — Arnold Kinkead
(74) *Attorney, Agent, or Firm* — Jordan and Hamburg LLP

(57) ABSTRACT

To provide a voltage controlled oscillator having small size and capable of obtaining a low phase noise characteristic over a large span of adjustable range of frequency. A quartz crystal having a characteristic (dielectric loss tangent: tan δ) better than that of fluorocarbon resin, LTCC or the like conventionally used as a substrate of a resonance part, and on which a fine pattern of metal film can be formed through a photolithography method, is used as a quartz-crystal substrate, and a conductive line is formed on the quartz-crystal substrate to form an inductance element in the resonance part. Accordingly, since the resonance part having a high Q value can be formed, it is possible to obtain a voltage controlled oscillator having small size and low loss over a wide frequency range.

2 Claims, 15 Drawing Sheets

FOREIGN PATENT DOCUMENTS

| | | |
|---|---|---|
| JP | 10-215119 | 8/1998 |
| JP | 2000-183647 | 6/2000 |
| JP | 2000-312115 | 11/2000 |
| JP | 2001-223529 | 8/2001 |
| JP | 2001-339240 | 12/2001 |
| JP | 2003-297927 | 10/2003 |
| JP | 2005-072154 | 3/2005 |
| JP | 2007-036822 | 2/2007 |
| JP | 2007-201772 | 8/2007 |
| JP | 2007-235034 | 9/2007 |

OTHER PUBLICATIONS

U.S. Appl. No. 12/924,515, filed Sep. 29, 2010, Yamakawa et al.
U.S. Appl. No. 12/924,468, filed Sep. 28, 2010, Onzuka et al.
U.S. Appl. No. 12/924,417, filed Sep. 28, 2010, Tsuda et al.
Peter Thoma: "Absolute calorimetric determination of dielectric loss factors at 2=10 4 s-1 and 4.2 k and application to the measurement of loss factors of standard capacitors at room temperature", IEEE Transactions on Instrumentation and Measurement, IEEE Service Center, Piscataway, NJ, US, vol. 15, No. 4, Dec. 1, 1980, pp. 328-330, XP011246154, ISSN: 0018-9456.

(a)

(b)

(c)

(a)

(b)

(c)

(d)

(a)

(b)

(c)

PRIOR ART

VOLTAGE CONTROLLED OSCILLATOR AND ELECTRONIC COMPONENT

BACKGROUND OF THE INVENTION

1. Field of the Invention

The present invention relates to a technique for forming a resonance part using an inductance element and a variable capacitance element, and a voltage controlled oscillator (VCO) and an electronic component using the resonance part.

2. Description of the Related Art

As shown in FIG. 19, for instance, a voltage controlled oscillator (VCO) includes a resonance part having a varicap diode VD whose electrostatic capacitance varies in accordance with a control voltage and an inductance element 11, and a feedback part 2 formed of a transistor 21 being an amplifying part and two capacitors C1, C2. In this example, a frequency signal resonated in the resonance part is amplified by the transistor 21, and is fed back to a series resonant circuit via the feedback part 2, thereby forming an oscillation loop. Note that 31 in FIG. 19 denotes a buffer amplifier that amplifies the frequency signal and outputs it to the outside. Further, 16, T3 and L denote an input terminal, an output terminal part and an inductance element, respectively. Although the illustration is omitted, the VCO is disposed on a base substrate made of ceramics such as LTCC (Low Temperature Co-fired Ceramics) using alumina ($Al_2O_3$) as a main component, for instance.

Incidentally, if the VCO is used in a high frequency band of, for example, several GHz or several tens of GHz by increasing an oscillation frequency thereof, problems as follows occur. Specifically, in a high frequency band, an absolute frequency included in a bandwidth of a peak part in a frequency characteristic is large, so that it becomes necessary to provide a Q value which is higher than that in a low frequency band. In order to achieve such a high Q value, the inductance element in the resonance part is required to have a large inductance value with a low loss.

Here, when a strip line formed on a base substrate is used as the inductance element, since a dielectric loss tangent (tan δ) of LTCC is large, a good characteristic regarding the Q value of the resonance part being a reciprocal of the dielectric loss tangent cannot be achieved. Further, when fluorocarbon resin is used as the base substrate, since a dielectric loss tangent of the fluorocarbon resin is about 0.001, the Q value of only about 1000 can be obtained. For this reason, a good phase noise characteristic cannot be obtained, and it is difficult to reduce power consumption. Further, when the base substrate is formed of a low-loss dielectric, although a high Q value with a low loss can be obtained, a size of the substrate becomes large.

Furthermore, in a VCO mounted in a radio communication device that outputs an electrical signal with a quite high frequency, which is, for example, an electrical signal in a GHz band (microwave), it is conceivable that a) an output signal of the VCO outputting a signal having a frequency lower than the frequency band is multiplied, b) GaAs (gallium arsenide compound) or the like is used as a base substrate, and c) a cavity resonator is used. However, in the case of a), a phase noise becomes large since a multiplication circuit is used. Further, in the case of b), a phase noise in the vicinity of an oscillation frequency of the VCO is deteriorated, and in the case of c), it becomes difficult to realize the downsizing.

Although Patent Document 1 describes a device such as the above-described VCO, no study has been made regarding the aforementioned problems. Further, according to Patent Document 2, there is known a technique for making a quartz crystal being a piezoelectric substrate generate an elastic wave to use the quartz crystal as a resonator whose oscillation frequency is in about several MHz band, for example, but, it is not possible to solve the above-described problems.

[Patent Document 1] Japanese Patent Application Laid-open No. Hei 10-209714

[Patent Document 2] Japanese Patent Application Laid-open No. 2007-201772

SUMMARY OF THE INVENTION

The present invention has been made based on such circumstances, and an object thereof is to provide a voltage controlled oscillator having small size and capable of obtaining a good phase noise characteristic over a wide frequency band. Further, an another object of the present invention is to provide an electronic component including an inductance element and a capacitance element and capable of obtaining a high Q value as a resonance part.

A voltage controlled oscillator of the present invention includes: a resonance part having a variable capacitance element whose electrostatic capacitance varies in accordance with a control voltage for frequency control input from the outside and an inductance element, and in which a series resonance frequency is adjusted in accordance with the electrostatic capacitance; and a feedback part amplifying a frequency signal from the resonance part and making the amplified signal to be fed back to the resonance part, in which the inductance element in the resonance part is a conductive line formed on a quartz-crystal substrate.

It is preferable that the resonance part has the variable capacitance element and a capacitance element whose capacitance is not varied by the voltage, and the capacitance element is formed of a pair of comb-like conductive paths which are provided on the quartz-crystal substrate and intersect with a space therebetween.

It is preferable that the quartz-crystal substrate is provided on a base substrate made of a dielectric, and the variable capacitance element, the feedback part and a peripheral component are provided on the base substrate.

It is preferable that the series resonance frequency is, for example, 5 GHz or more.

An electronic component of the present invention includes: a quartz-crystal substrate; and an inductance element formed of a conductive line formed on the quartz-crystal substrate.

It is also possible to use a substrate made of lithium tantalate, lithium niobate, silicon or sapphire, instead of the quartz-crystal substrate.

According to the present invention, an inductance element formed of a conductive line is formed on a quartz-crystal substrate whose dielectric loss tangent (tan δ=1/Q) is small to be about 0.00008, and a resonance part is configured by the inductance element and a capacitance element, so that a high Q value can be achieved. Further, a fine pattern of metal film can be formed on the quartz-crystal substrate by photolithography, so that it is possible to form a small-sized resonance part. Therefore, by forming an electronic component, which is, for instance, a voltage controlled oscillator, by using the resonance part, it is possible to realize the downsizing and to obtain a low phase noise characteristic in a wide frequency band, which is proved also by later-described data.

DETAILED DESCRIPTION OF THE PREFERRED EMBODIMENT(S)

Figure 1:
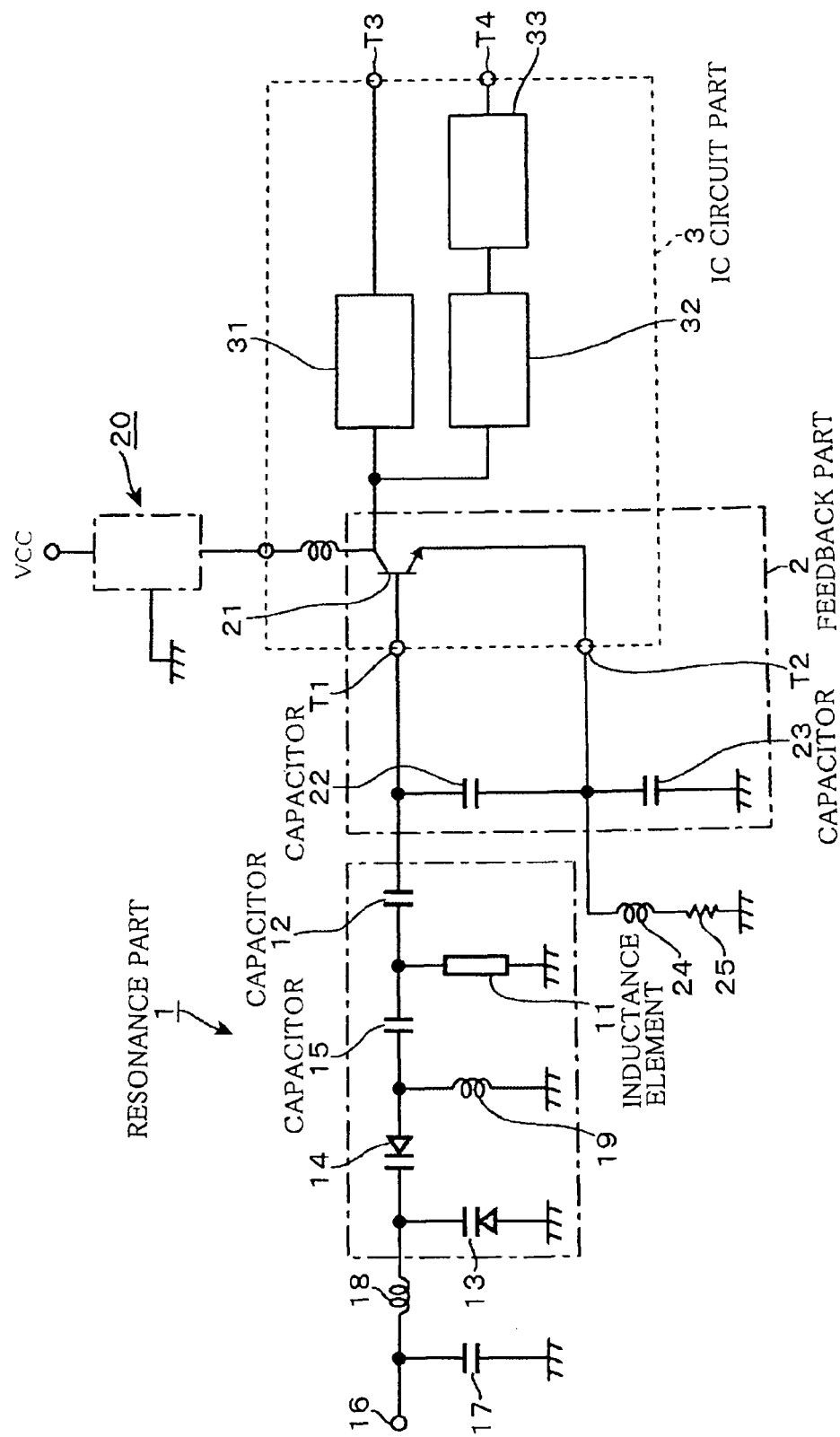
FIG. 1 is a circuit diagram showing a VCO as an example of an embodiment of an electric circuit of the present invention.
Figure 2:
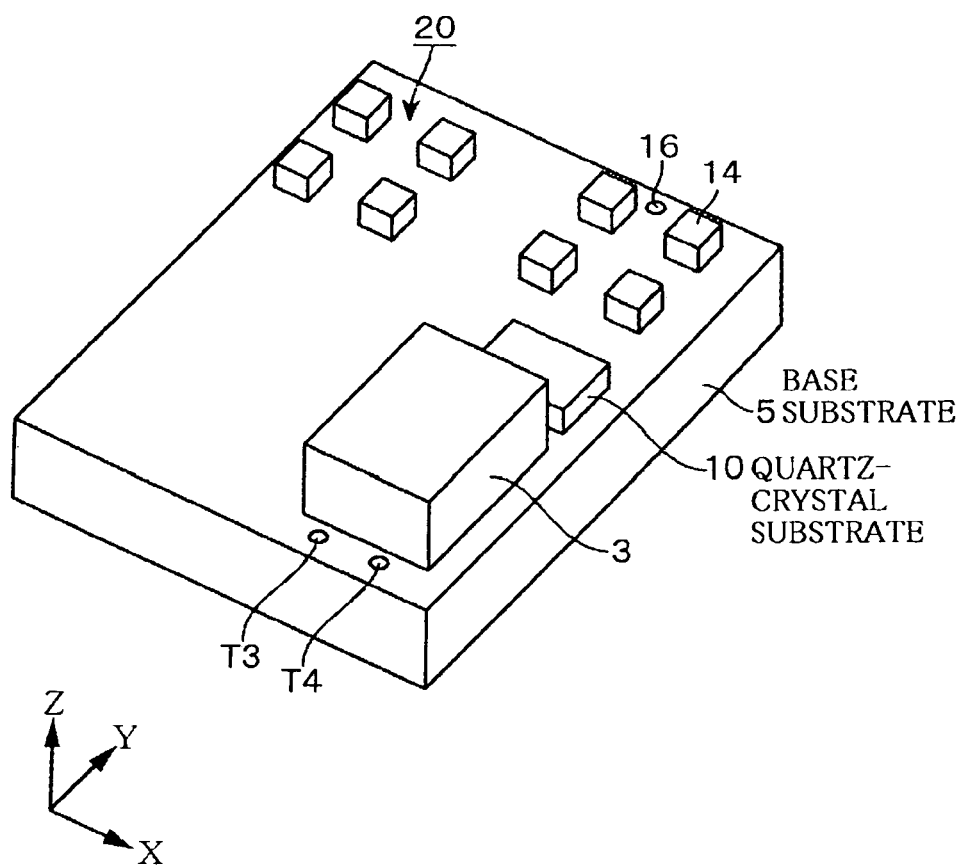
FIG. 2 is a perspective view showing an external appearance of the above-described VCO.

Before describing a structure of an embodiment of a voltage controlled oscillator (VCO) of the present invention, a circuitry of the embodiment will be described with reference to FIG. 1. In FIG. 1, a resonance part 1 is provided with a series circuit for series resonance including an inductance element 11 formed of a conductive line 48 as will be described later and a capacitor 12 being a capacitance element. A series circuit formed of a first varicap diode 13, a second varicap diode 14 and a capacitor 15 being a capacitance element is connected in parallel with the inductance element 11, which forms a parallel circuit for parallel resonance. Specifically, the resonance part 1 has a series resonance frequency (resonance point) of the series circuit and a parallel resonance frequency (antiresonance point) of the parallel circuit, and an oscillation frequency is determined by a frequency of the resonance point. In this example, a constant of each circuit element is set so that the resonance point becomes greater than the antiresonance point, and by providing the antiresonance point as above, a frequency characteristic in the vicinity of the resonance point becomes steep.

Further, in FIG. 1, 16 denotes an input terminal for control voltage, and by a control voltage supplied to the input terminal 16, capacitance values of the first varicap diode 13 and the second varicap diode 14 are adjusted. Accordingly, the antiresonance point of the parallel circuit is shifted, and as a result of this, the resonance point is also shifted, which results in adjusting the oscillation frequency. The reason why the second varicap diode 14 is used in addition to the first varicap diode 13 is to secure a large span of adjustable range of frequency. 17 denotes a capacitor for voltage stabilization, and 18, 19 are bias inductors.

Further, a feedback part 2 is provided on a rear stage side of the resonance part 1, and the feedback part 2 includes an NPN-type transistor 21 serving as an amplifying part and having its base connected to the capacitor 12, and a series circuit of capacitors 22, 23 serving as feedback capacitance elements and connected between a connection point between the capacitor 12 and the base of the transistor 21 and a ground. An emitter of the transistor 21 is connected to a connection point between the capacitors 22 and 23, and grounded via an inductance 24 and a resistance 25. The transistor 21 is provided in a chip of an IC circuit part (LSI) 3 indicated by a dotted line, and the base and the emitter of the transistor 21 are respectively connected to both ends of the capacitor 22 via terminal parts (electrodes) T1, T2 of the chip.

In the circuit as described above, when the control voltage is input into the input terminal 16 from the outside, oscillation is made at a frequency of the resonance point, which is, for example, 10 GHz, by an oscillation loop formed of the resonance part 1 and the feedback part 2.

In the IC circuit part 3, there are provided two buffer amplifiers 31, 32 connected in parallel with each other to a collector of the transistor 21, for example, in which it is structured such that an oscillation output (signal of oscillation frequency) is taken out from one buffer amplifier 31 via a terminal part T3, and an oscillation output is taken out from the other buffer amplifier 32 via a frequency dividing circuit 33 and a terminal part T4.

Note that the resonance part 1 may also have a circuitry in which the varicap diode and the inductance element 11 are serially connected and an oscillation frequency is determined by a series resonance frequency of the series circuit, and in this case, the varicap diode also serves as the capacitance element in "WHAT IS CLAIMED IS".

Next, a concrete overview of the VCO and a layout of the above-described resonance part 1 and the circuit part 3 will be described with reference to FIG. 2 to FIG. 5. The VCO is formed on a base substrate 5 made of ceramics such as LTCC (Low Temperature Co-fired Ceramics) using alumina (Al$_2$O$_3$) as a main component, for instance, and on the base substrate 5, there are disposed electronic components formed of the resonance part 1, the feedback part 2, the circuit part 3 as well as a peripheral component and the like. On the base substrate 5, there is formed a coplanar line having a ground electrode 51 and conductive lines 6 for electrically connecting the above-described respective electronic components on the base substrate 5 and formed of a metal film in which, for example, Cr (chromium) and Cu (copper) are laminated in this order from the bottom, in which these ground electrode 51 and conductive lines 6 are disposed to be separated from each other, as shown in FIG. 5. Note that a part of an area on the base substrate 5 is cut out and enlarged to be illustrated in FIG. 5, in which hatching is provided in the ground electrode 51. Further, in FIG. 5, the conductive lines 6 respectively connected to connecting terminals 8 for the aforementioned base, emitter and collector of the transistor 21, among a plurality of connecting terminals 8 of the circuit part 3, are denoted by B, E and C, respectively.

Figure 3:
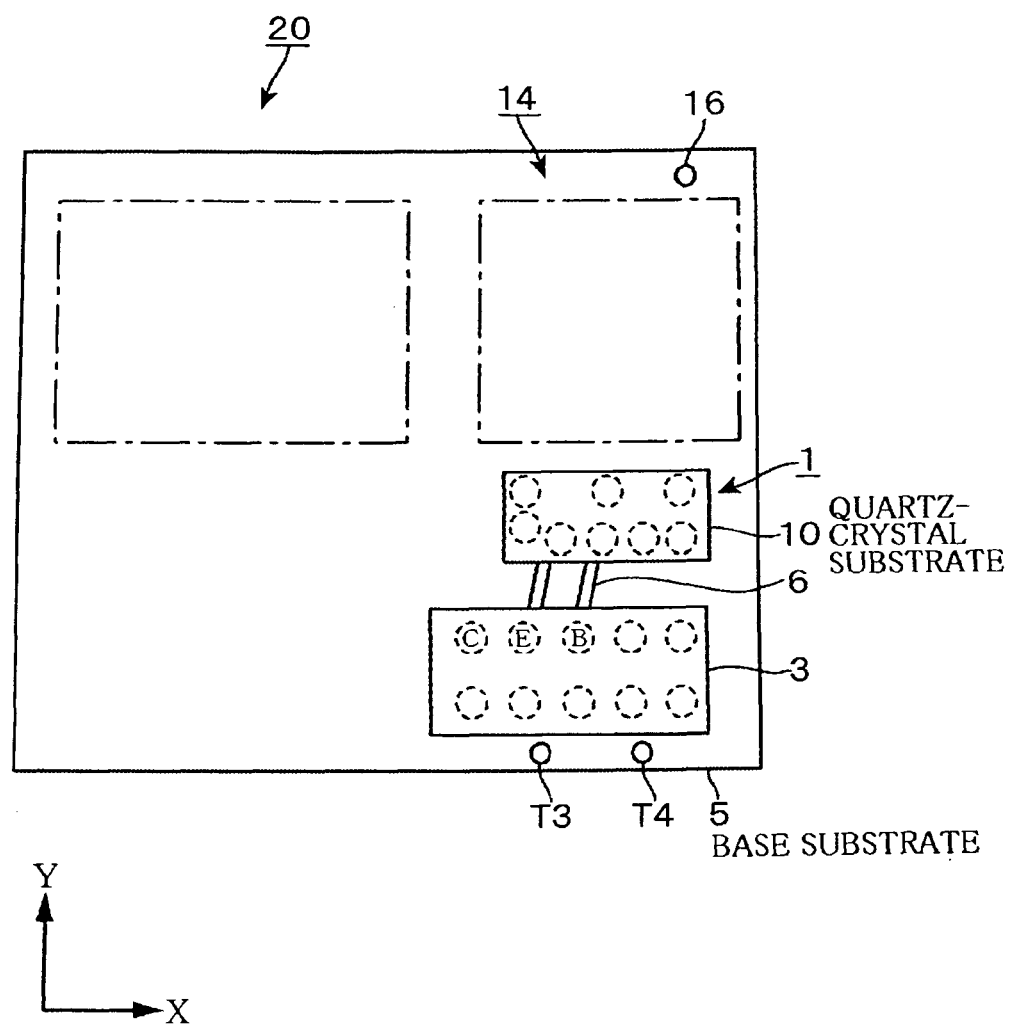
FIG. 3 is a plan view showing the above-described VCO.
Figure 4:
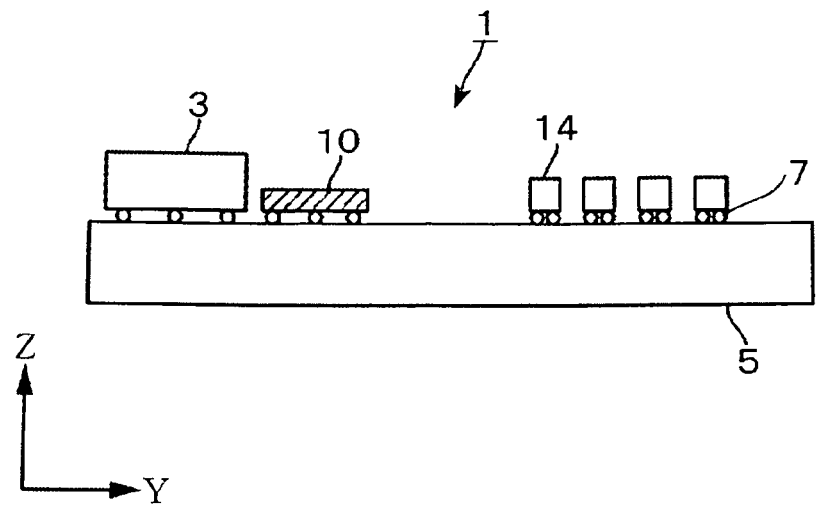
FIG. 4 is a side view showing the above-described VCO.
Figure 5:
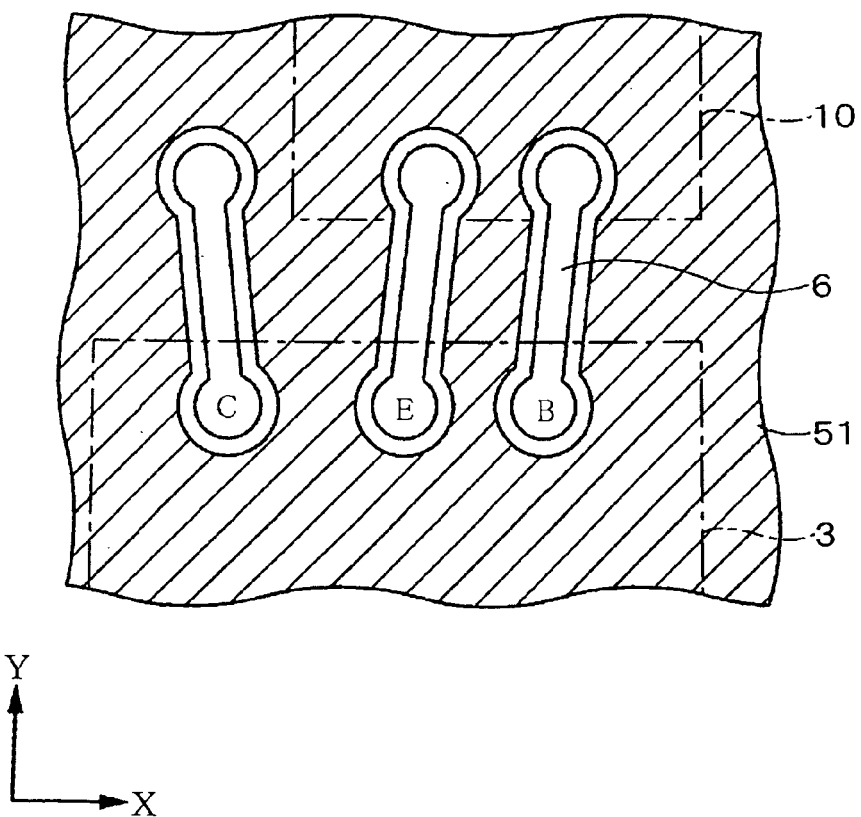
FIG. 5 is an enlarged plan view showing the above-described VCO.

The above-described electronic components are respectively fixed on the base substrate 5 by connecting parts 7 such as, for example, solder balls, and the respective connecting terminals 8 and the conductive lines 6 are electrically connected, as shown in FIG. 4. Further, although the illustration is omitted in FIG. 2 and the like, these electronic components are connected via the base substrate 5 by the above-described conductive lines 6 routed around on the base substrate 5, thereby configuring an electric circuit as shown in the aforementioned FIG. 1. In FIG. 3, 20 denotes a bias circuit element part for determining an operation of an oscillation-stage transistor 21 and formed by combining not-shown capacitor and resistance, and a part of the bias circuit element part 20 is grounded. Note that the illustration of conductive lines 6 is omitted in FIG. 2 and FIG. 4, and further, FIG. 3 and FIG. 5 illustrate only a part of the conductive lines 6.

Figure 6:
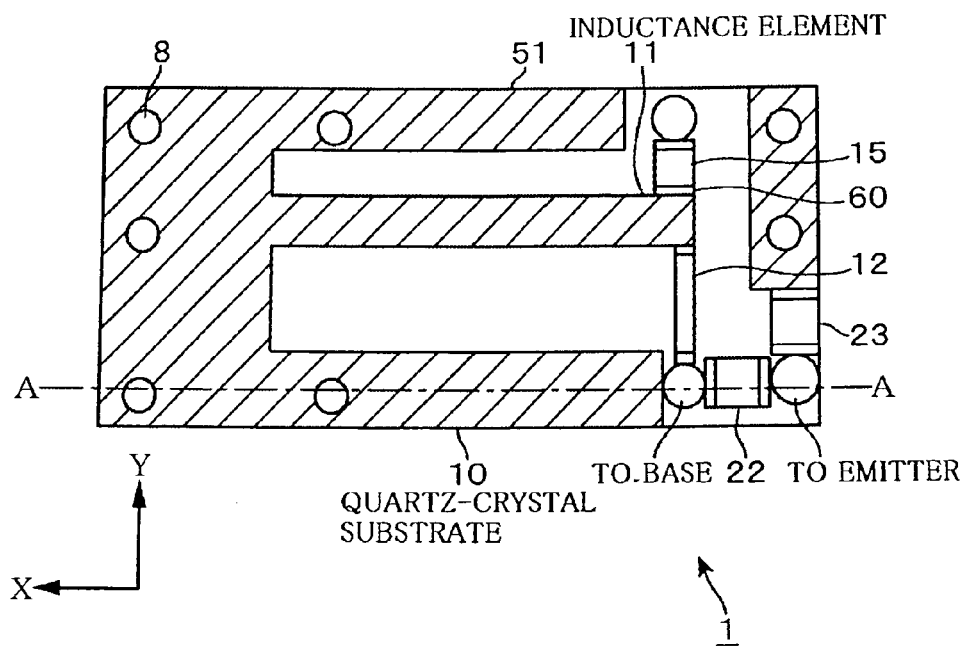
FIG. 6 is a plan view showing a quartz-crystal substrate mounted in the above-described VCO.
Figure 7:
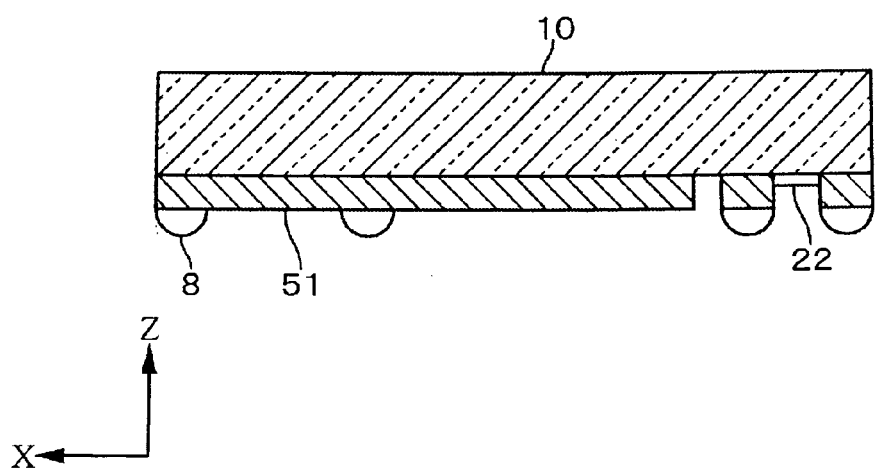
FIG. 7 is a side view showing the above-described quartz-crystal substrate.
Figure 8:
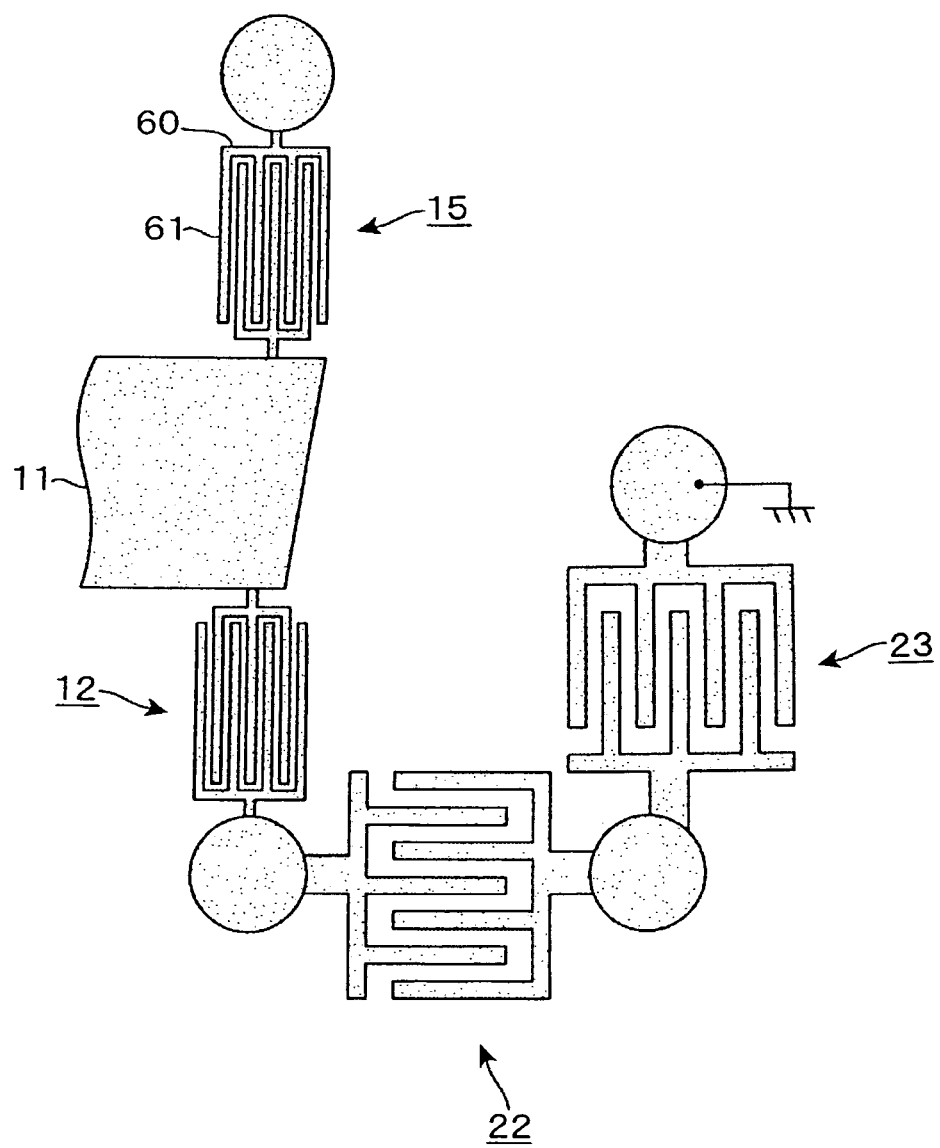
FIG. 8 is a plan view showing the above-described quartz-crystal substrate.

As shown in FIG. 6 and FIG. 7, the inductance element 11, the capacitors 12, 15 in the above-described resonance part 1, and the capacitors 22, 23 in the feedback part 2 are formed on a quartz-crystal substrate 10 having a size of about several mm square, for instance, and are formed by utilizing a photolithography method, as will be described later. Further, it is structured such that a surface of the quartz-crystal substrate 10 on which the circuit elements (the capacitors 12, 15, 22, 23, and the inductance element 11) are formed is faced to the base substrate 5 side and abutted on the substrate so that the connecting terminals 8 and the conductive lines 6 are connected via the connecting parts 7, as described above. The quartz-crystal substrate 10 is, for example, an AT-cut quartz-crystal plate, and has a relative dielectric constant $\in$ of about 4.0, and a loss of electric energy (dielectric loss tangent: $\tan \delta$) of about 0.00008. Therefore, a Q value of the quartz-crystal substrate 10 becomes about 12500 ($=1/0.00008$). Further, although the illustration is simplified in FIG. 6, each of the above-described capacitors 12, 15, 22, 23 is actually formed of a comb electrode including a pair of common electrode parts 60 formed to be parallel to each other, for example, and a group of electrode fingers (conductive paths) 61 extending in a comb-teeth shape from the common electrode parts 60 and intersecting with one another, and the respective common electrode parts 60 are connected to the connecting terminal 8 and the inductance element 11. The inductance element 11 is formed of a strip line being a conductive line, as shown in FIG. 6. Note that FIG. 7 shows a view in which the quartz-crystal substrate 10 is cut along A-A line in FIG. 6. Further, FIG. 8 is a view illustrating a part of the quartz-crystal substrate 10 shown in FIG. 6 in an enlarged manner.

Figure 9:
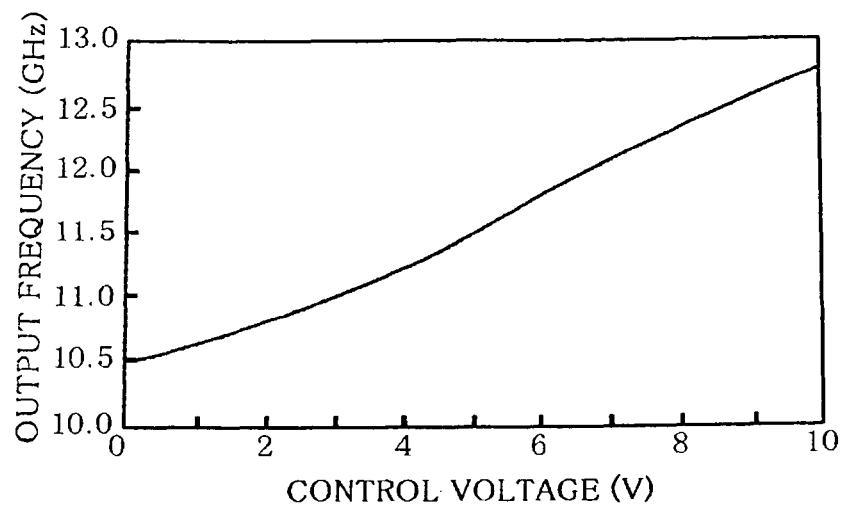
FIG. 9 is a diagram of characteristic example showing a characteristic obtained by the above-described VCO.
Figure 10:
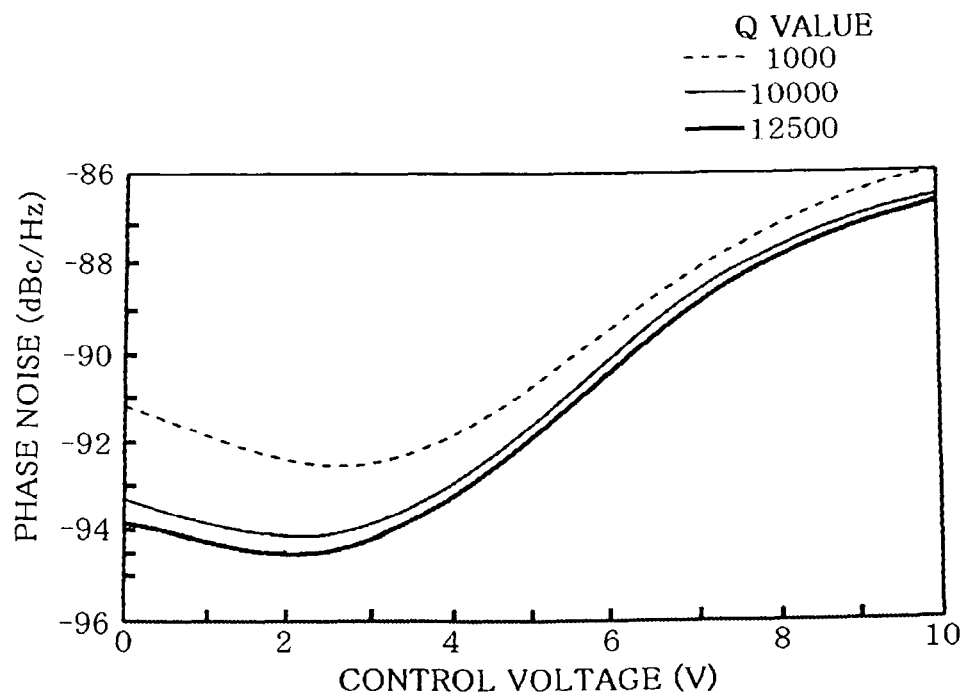
FIG. 10 is a diagram of characteristic example showing a characteristic obtained by the above-described VCO.

In the VCO, when a voltage for control (control voltage) is applied to the input terminal 16, oscillation is made at a frequency of the resonance point, which is, for example, 10 GHz, by the oscillation loop formed of the resonance part 1 and the feedback part 2 as described above, and a frequency signal corresponding to the oscillation frequency and a divided output of the frequency signal are taken out from the terminal part T3 and the terminal part T4, respectively. At this time, since the dielectric loss tangent of the quartz-crystal substrate 10 is quite small as described above, the inductance element 11 is formed by the conductive line on the quartz-crystal substrate 10, and thus a high Q value is provided, when compared to a conventional substrate made of fluorocarbon resin (Q value=1000), the quartz-crystal substrate 10 can reduce the phase noise to quite a low level over a wide frequency band. Specifically, a variable range of frequency in which a low phase noise characteristic can be obtained is wide. Results of simulations performed with respect to the VCO are shown in FIG. 9 and FIG. 10, in which it can be confirmed that it is possible to adjust an output frequency in a frequency band of GHz band in accordance with a control voltage, and further, it is possible to obtain a phase noise characteristic, which is better than a conventional characteristic, over a wide bandwidth. Note that FIG. 10 shows a phase noise at a position displaced by 10 kHz from the oscillation frequency. Further, for reference, FIG. 10 additionally shows a characteristic of $Al_2O_3$ (HTCC) ($\tan \delta=0.001$, Q value=10000), for example. Further, FIG. 10 shows a result obtained by calculating a characteristic at the time of unloaded state (state where the inductance element 11 and the capacitors 12, 15, 22, 23 are not mounted on the base substrate 5). Note that the aforementioned resonance part 1 has an inductivity at the time of resonance.

According to the above-described embodiment, since there is used a quartz crystal, as the quartz-crystal substrate 10, having a characteristic ($\tan \delta$) better than that of fluorocarbon resin, LTCC or the like conventionally used as a substrate of the inductance element 11 and the capacitor 12, and on which a fine pattern of metal film can be formed through a photolithography method, it is possible to obtain a good phase noise characteristic (low phase noise characteristic) over a wide frequency band, and further, since the inductance element 11, and the capacitors 12, 15, 22, 23 can be formed in one chip with the use of the photolithography method, it is possible to obtain the resonance part 1 and the VCO which are small size and durable to physical shock in an inexpensive manner.

Further, by configuring the capacitors 12, 15, 22, 23 by the comb electrodes using the photolithography method as described above, large opposing areas (charge storage areas) of each of the electrode fingers 61, 61 can be provided, so that capacitors having small size and low loss can be easily obtained. Further, since the inductance element 11 and the capacitors 12, 15, 22, 23 can be directly formed on the quartz-crystal substrate 10, it is possible to shorten the routing of the electrode (conductive path), compared to a case where electronic components corresponding to these inductance element 11 and capacitors 12, 15, 22, 23 are mounted, for instance, and accordingly, it is possible to suppress the loss of electrical signal.

When an electric power value required for an actual operation, including that of a frequency divider, is checked in the VCO of the present invention, a voltage and a current are about 3.5 V and 75 mA, respectively. On the other hand, when a characteristic of VCO which uses conventional GaAs as a base substrate 5 is checked in the same manner, a voltage and a current are about 5 V and 300 mA, respectively. Therefore, it is confirmed that the VCO of the present invention can reduce power consumption more than the conventional VCO.

Here, a quartz crystal has been used as a piezoelectric element in a device utilizing an elastic wave, and the present invention focuses attention on excellent physical properties ($\tan \delta$ and relative dielectric constant $\in$) of the quartz crystal and a point such that a fine pattern of metal film can be formed on a surface of the quartz crystal with the use of the photolithography method, and forms the inductance element 11 forming the resonance part 1 on the quartz-crystal substrate 10.

Each of the above-described capacitors 12, 15, 22, 23 may also be configured such that two electrode lines, for instance, instead of the comb electrode, are provided so as to face each other and an electric charge is accumulated between the lines, or a multilayer ceramic capacitor may also be used as the above-described capacitor. When the multilayer ceramic capacitor is used, it is also possible that a chip formed of the multilayer ceramic capacitor is disposed on the quartz-crystal substrate 10, or the chip is provided on the base substrate 5 and the chip and the quartz-crystal substrate 10 (connecting terminals 8 and the inductance element 11) are connected via the conductive lines 6. Therefore, in order to obtain the above-described effect of the embodiment, it is only required that at least the inductance element 11 in the resonance part 1 is formed on the quartz-crystal substrate 10. The elements other than the inductance element 11 may also be formed on a substrate other than the quartz-crystal substrate 10 (for instance, the base substrate 5 or a substrate other than the quartz-crystal substrate 10 formed on the base substrate 5).

Figure 11:
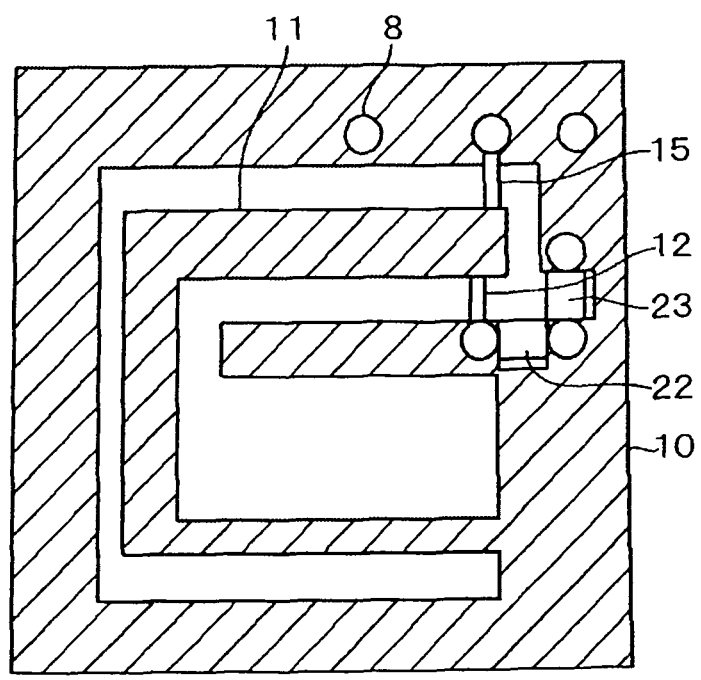
FIG. 11 is a plan view showing an another configuration example of the above-described quartz-crystal substrate.

Further, as a layout of the conductive line 48 on the quartz-crystal substrate 10, it is also possible that the inductance element 11 is routed around on the quartz-crystal substrate 10, as shown in FIG. 11, for example.

As a substrate on which the above-described inductance element 11 is formed, it is also possible to use a substrate made of $LiTaO_3$ (lithium tantalate), $LiNbO_3$ (lithium niobate), Si (silicon), sapphire, or the like, for instance, instead of the quartz-crystal substrate 10. Since these materials also have a small tan δ, they are effectively used as a substrate for the inductance element 11. Further, as a material forming the conductive lines 6, the capacitors 12, 15, 22, 23, and the inductance element 11 on the quartz-crystal substrate 10, it is also possible to use at least one kind of Cu (copper), Au (gold), Cr (chromium), Ni (nickel), Ti (titanium), W (tungsten), V (vanadium), Ta (tantalum), Mo (molybdenum), Ag (silver), Pd (palladium), In (indium) and Sn (tin), for example, other than aluminum.

Figure 19:
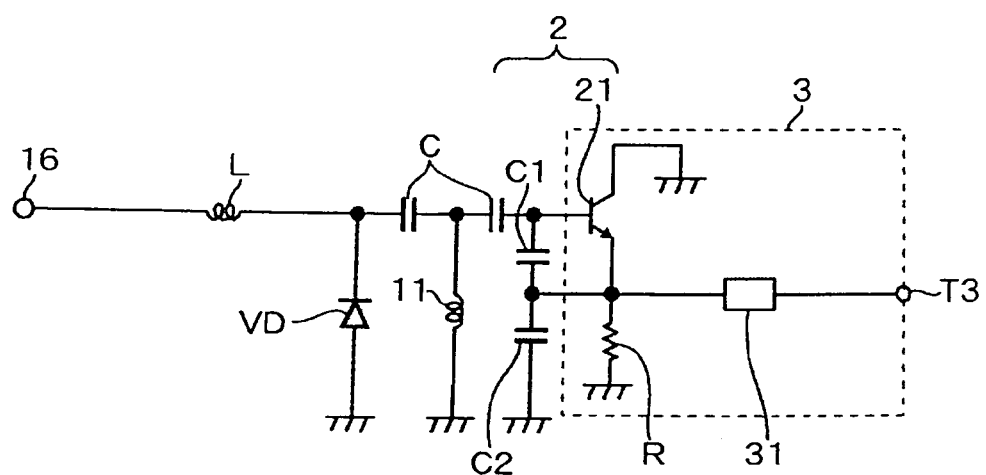
FIG. 19 is a diagram of an example of electric circuit showing a configuration of a conventional VCO.

Further, in the above-described example, the two varicap diodes 13, 14 are disposed, but, it is also possible to dispose one of them, and further, it is also possible to make one of these varicap diodes 13, 14 function as the capacitor 12, as shown in the aforementioned FIG. 19.

Further, although the description regarding the VCO is made in the above-described example, a filter circuit being an electric circuit formed of an inductance element and a capacitance element also has a problem such that when the circuit is used in a high frequency band of GHz band, a good filter characteristic cannot be obtained if a Q value in a resonance part 1 is small. Therefore, the present invention is effective for an electronic component including an inductance element.

Figure 12:
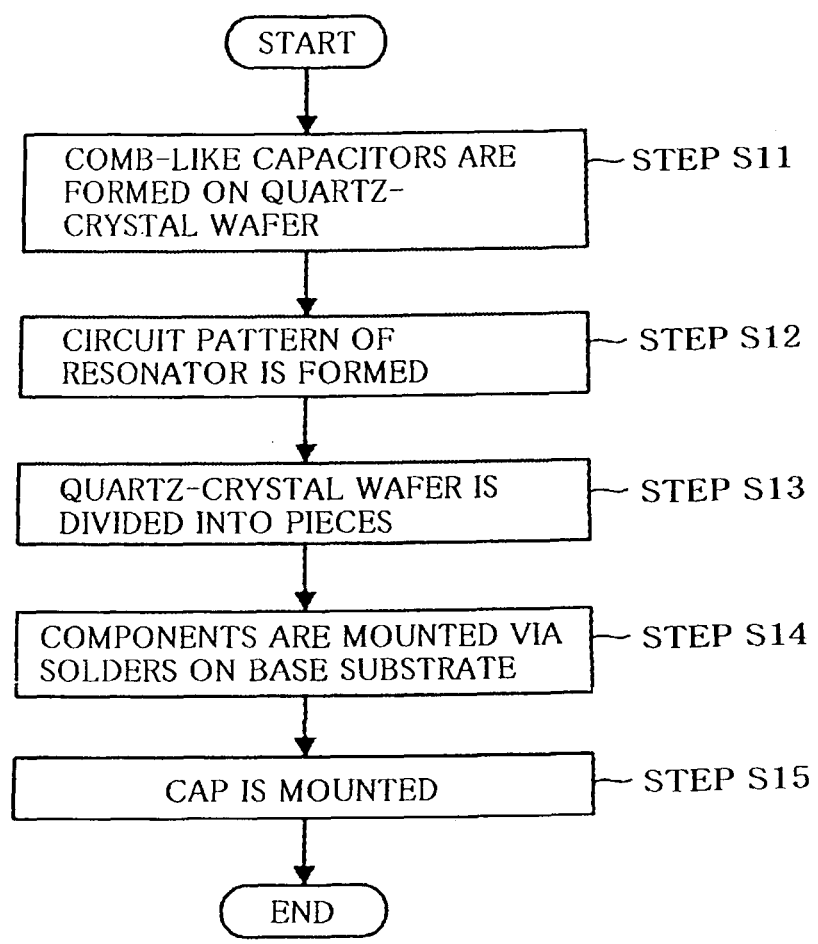
FIG. 12 is a flow diagram showing an example of a forming method of the above-described VCO.
Figure 13:
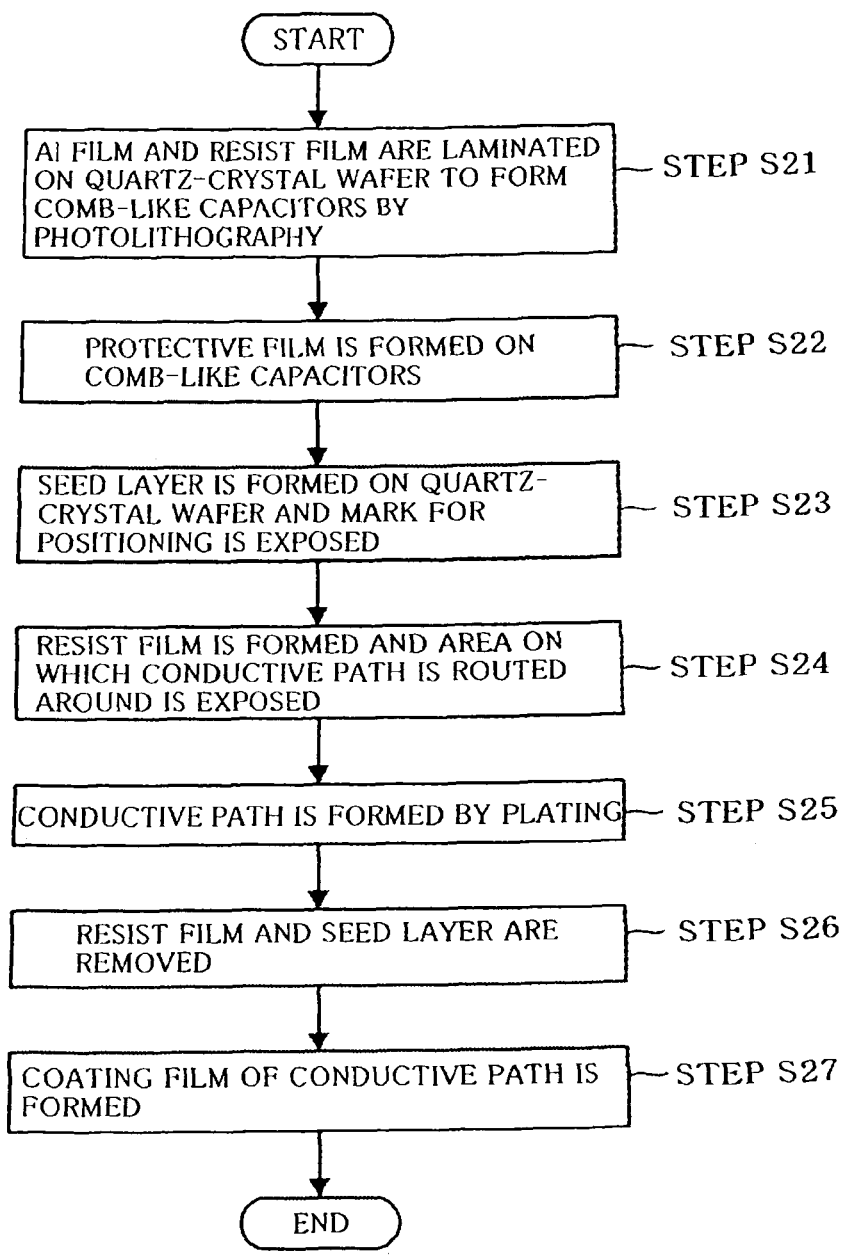
FIG. 13 is a flow diagram showing an example of the forming method of the above-described VCO.

Subsequently, an example of a method of manufacturing the above-described VCO will be described. First, a general outline of the manufacturing method will be described. As shown in FIG. 12, a large number of comb electrodes described above are formed, on a quartz-crystal wafer 40 having a diameter of 10 cm, for example, in a layout shown in the aforementioned FIG. 6 as the condensers (capacitors) 12, 15, 22, 23 (step S11), and subsequently, the conductive line 48 is disposed on the quartz-crystal wafer 40, thereby forming a circuit pattern of resonator (inductance element 11) and the ground electrode 51 (step S12). Next, the quartz-crystal wafer 40 is cut by dicing or the like, for instance, so that the aforementioned quartz-crystal substrate 10 is divided into pieces (divided into chips) (step S13), and the components such as the quartz-crystal substrate 10 and the transistor 21 are mounted on the base substrate 5 via the solders (connecting parts 7) printed on the base substrate 5 having a wafer shape, for instance (step S14). Thereafter, the base substrate 5 is divided into pieces, and after that, a not-shown cap is mounted to cover the respective components on the base substrate 5 (step S15). As above, the aforementioned VCO is formed.

Figure 14:
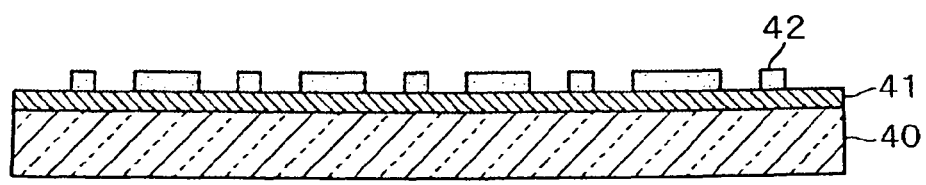
FIGS. 14(a), 14(b) and 14(c) are process drawings showing an example of the forming method of the above-described VCO.
Figure 14:
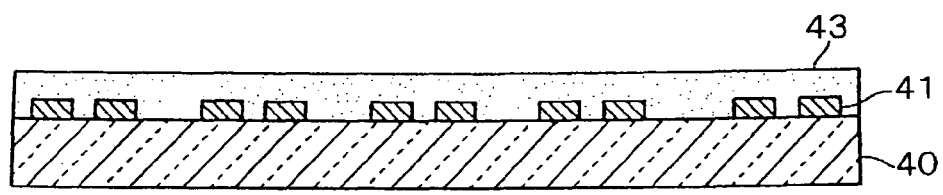
Figure 14:
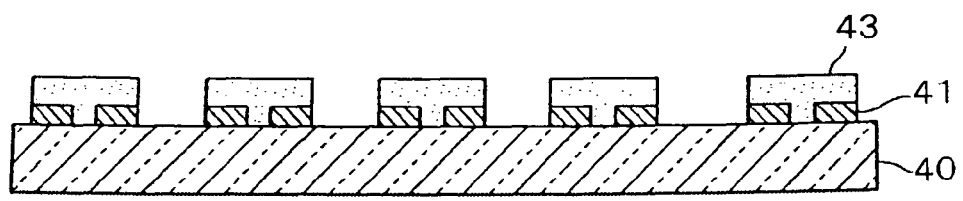
Figure 15:
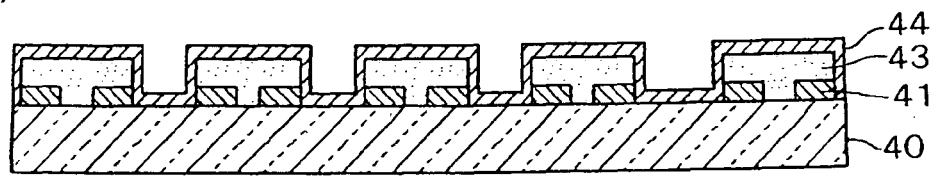
FIGS. 15(a), 15(b), 15(c) and 15(d) are process drawings showing an example of the forming method of the above-described VCO.
Figure 15:
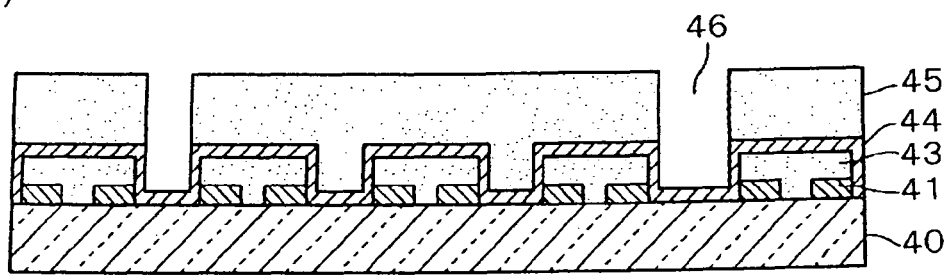
Figure 15:
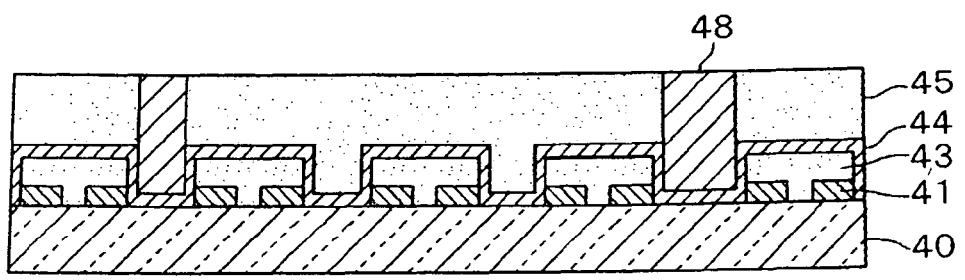
Figure 15:
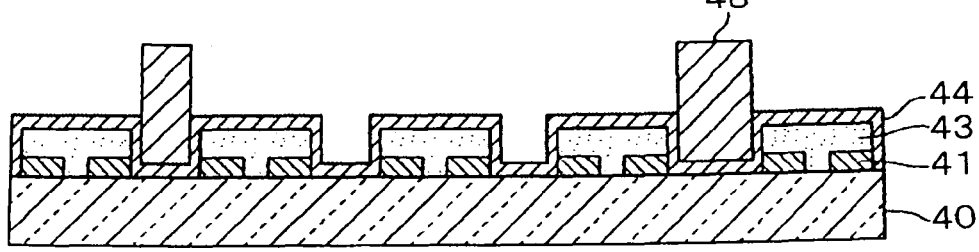
Figure 16:
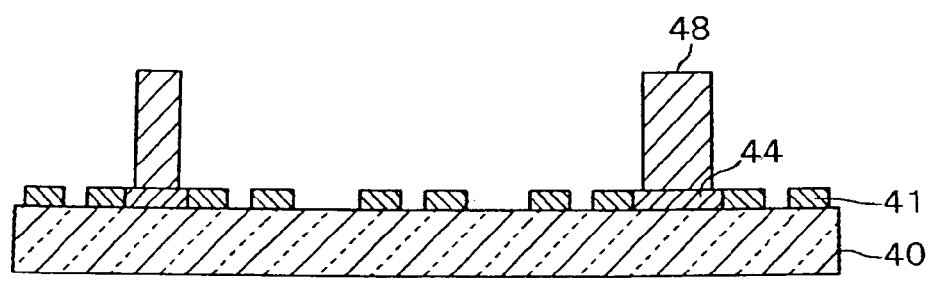
FIGS. 16(a), 16(b) and 16(c) are process drawings showing an example of the forming method of the above-described VCO.
Figure 16:
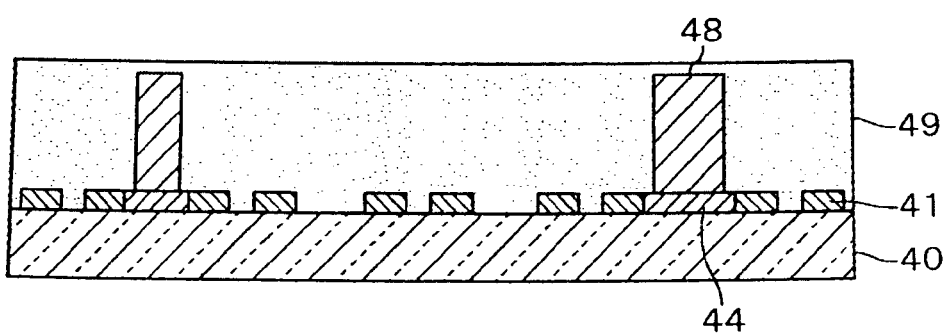
Figure 16:
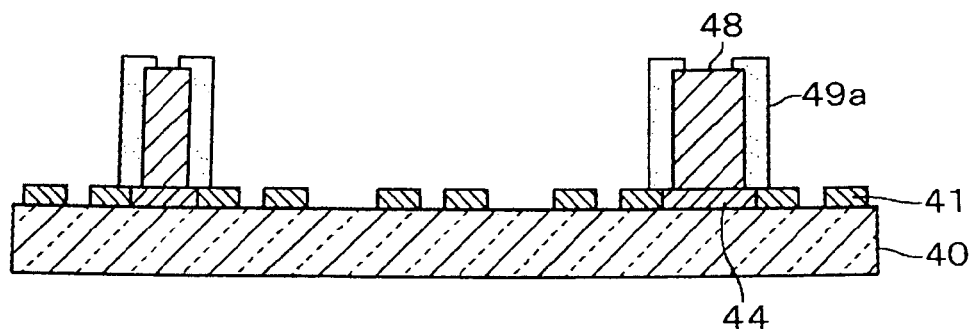
Figure 17:
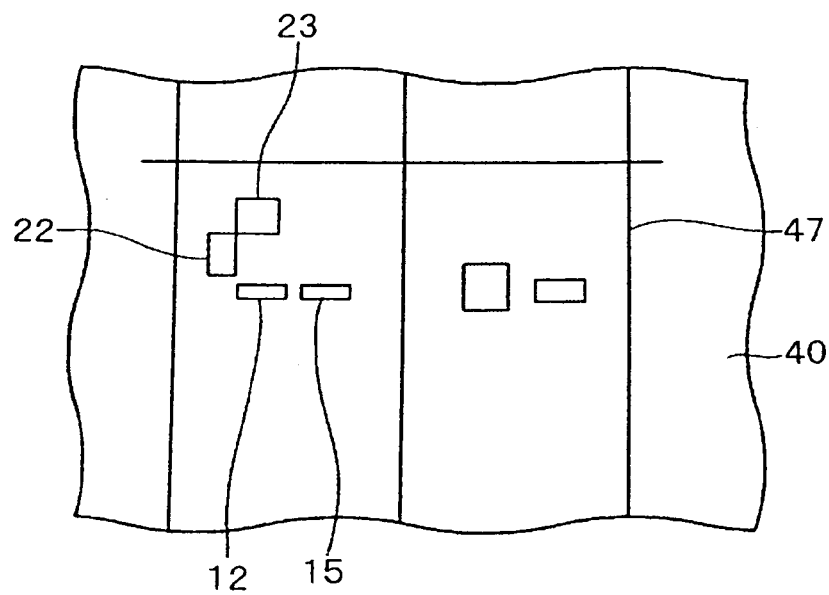
FIG. 17 is a schematic diagram showing a VCO formed through the above-described flow.

Next, the forming method of the resonance part 1 in the above-described step S11 and step S12 will be concretely described with reference to FIG. 13 to FIG. 18. First, the above-described quartz-crystal wafer 40 is washed, and thereafter, as shown in FIG. 14(a), a metal film 41 such as, for example, aluminum and a positive-type first resist film 42 are laminated on the quartz-crystal wafer 40 in this order from the bottom, and exposure processing and development processing are performed to form a pattern for forming the comb electrodes (capacitors 12, 15, 22, 23) on the first resist film 42. Subsequently, through dry etching using etching gas such as C12 gas, for example, the metal film 41 is etched to transfer the pattern of the first resist film 42 on the metal film, and thereafter, the first resist film 42 is removed, as shown in FIG. 17 (step S21). Note that although the illustration is omitted, on the pattern of the above-described first resist film 42, an alignment mark for performing positioning of the quartz-crystal wafer 40, an orientation-flat mark used when performing the exposure processing, and a later-described dicing line 47 for dividing the respective quartz-crystal substrates 10 are formed together with the patterns of the capacitors 12, 15, 22, 23, and on the quartz-crystal wafer 40, there is disposed an electrode film including patterns of not only the capacitors 12, 15, 22, 23 but also these marks and line. Further, in FIGS. 14 to FIGS. 16, the capacitors 12, 15, 22, 23 are schematically illustrated.

Next, as shown in FIG. 14(b), a protective film 43 for protecting the electrode film of the capacitors 12, 15, 22, 23 and the like from etching of a later-described seed layer 44, is formed on the quartz-crystal wafer 40 by using a negative-type resin (polyimide) film or the like. Further, exposure processing is performed via a not-shown mask so that the protective film 43 remains on the above-described electrode film of the capacitors 12, 15, 22, 23 and the like. Note that the above-described exposure processing is performed by using an individually different mask for each of the capacitors 12, 15, 22, 23 and the aforementioned alignment mark and orientation-flat mark.

Subsequently, as shown in FIG. 14(c), exposure processing is performed to remove unnecessary protective film 43 (step S22). Further, after the protective film 43 is cured by heat treatment, for instance, a scum (residue of the protective film 43) on the quartz-crystal wafer 40 is removed by a plasma of $O_2$ gas, for instance. Subsequently, although the illustration is omitted, by forming a resist film and performing exposure processing and development processing, a resin film is formed on the aforementioned respective marks. Note that although the detailed explanation is omitted, the above-described protective film 43 is set to have a predetermined size so that the electrode film of the capacitors 12, 15, 22, 23 and the like is not corroded by etching solution at the time of performing etching on the seed layer 44.

Further, as shown in FIG. 15(a), the seed layer 44 is formed by laminating a Cr (chromium) film and a Cu (copper) film in this order from the bottom through vapor deposition processing, for example, and by using a lift-off device (lift-off bath, for instance), the aforementioned resin film on the mark and the seed layer 44 on the resin film are removed so that the mark is exposed (step S23). Thereafter, as shown in FIG. 15(b), a negative-type second resist film 45 is formed on the seed layer 44 while performing positioning using the above-described mark, and subsequently, a recessed part 46 is formed by performing exposure processing and development processing to remove the second resist film 45 in an area in which the conductive line 48 (the inductance element 11 and the ground electrode 51) is formed (step S24). Note that when the aforementioned mark is exposed by removing the above-described seed layer 44, it is also possible that the seed layer 44 is formed without forming the resin film between the mark and the seed layer 44, and thereafter, coating processing, exposure processing, development processing and etching processing of resist film are performed, to thereby remove the seed layer 44 on the mark.

Next, as shown in FIG. 15(c), the conductive line 48 corresponding to the ground electrode 51 and the inductance element 11 is embedded in the recessed part 46 of the second resist film 45 through, for example, electrolytic plating (step S25), and the second resist film 45 is removed, as shown in FIG. 15(d). Subsequently, the seed layer 44 and the protective film 43 are removed, as shown in FIG. 16(a) (step S26). At the time of performing the removal (etching) of the seed layer 44, the seed layer 44 remains under the conductive line 48 since the etching solution is difficult to reach under the conductive line, so that the capacitor 12 (15, 22, 23) and the conductive line 48 are electrically connected via the seed layer 44.

Figure 18:
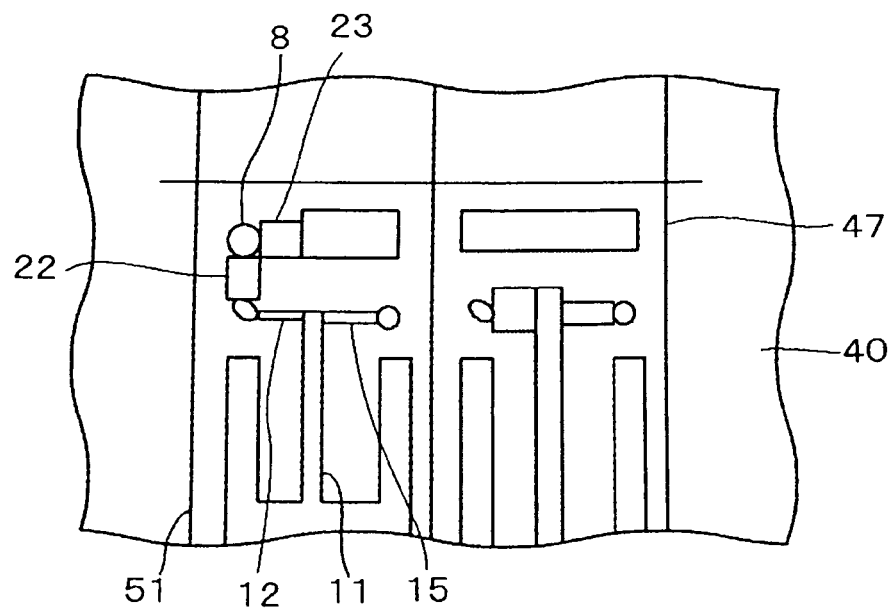
FIG. 18 is a schematic diagram showing the VCO formed through the above-described flow.

As above, on the quartz-crystal wafer 40, the capacitors 12, 15, 22, 23, the inductance element 11, the ground electrode 51, the dicing line 47 for dividing the respective quartz-crystal substrates 10 and the like are formed, as shown in FIG. 18. Subsequently, as shown in FIGS. 16(b) and 16(c), coating processing, exposure processing, development processing and heat treatment (curing processing) of resin film 49 are performed, to thereby form a coating film 49a so as to cover a lateral side and a peripheral edge part of an upper end surface of the above-described conductive line 48 (step S27). After that, the connecting terminals 8 are formed on the conductive line 48, and thereafter, the aforementioned dicing process (step S13) is carried out, to thereby divide the quartz-crystal substrate 10 into pieces.

What is claimed is:

1. A voltage controlled oscillator, comprising:
    a resonance part having a variable capacitance element, whose electrostatic capacitance varies in accordance with a control voltage for frequency control input from the outside, an inductance element, and a fixed capacitance element that has a fixed electrostatic capacitance, and in which a series resonance frequency is adjusted in accordance with the electrostatic capacitance; and
    a feedback part amplifying a frequency signal from said resonance part and making the amplified signal to be fed back to said resonance part; and
    wherein the inductance element in said resonance part is a conductive line formed on a quartz-crystal substrate;
    wherein the quartz-crystal substrate is provided on a base substrate made of a dielectric, and on the base substrate are provided the variable capacitance element, feedback part and peripheral component;
    wherein the series resonance frequency is 5 Ghz or more and
    wherein said fixed capacitance element is formed from a pair of comb-like conductive paths which intersect with a space therebetween, and which are provided on the quartz-crystal substrate on which said inductance element is formed.

2. The voltage controlled oscillator according to claim 1, wherein provided on the quartz-crystal substrate are conductive paths from only the elements that configure the resonance part and feedback part.

* * * * *